(12) United States Patent
Hart

(10) Patent No.: US 10,477,698 B1
(45) Date of Patent: Nov. 12, 2019

(54) SOLDER COLUMNS AND METHODS FOR MAKING SAME

(71) Applicant: TopLine Corporation, Irvine, CA (US)

(72) Inventor: Martin B. Hart, Irvine, CA (US)

(73) Assignee: TOPLINE CORPORATION, Irvine, CA (US)

( * ) Notice: Subject to any disclaimer, the term of this patent is extended or adjusted under 35 U.S.C. 154(b) by 0 days.

(21) Appl. No.: 16/440,905

(22) Filed: Jun. 13, 2019

Related U.S. Application Data

(60) Provisional application No. 62/835,322, filed on Apr. 17, 2019.

(51) Int. Cl.
  *B23K 1/00* (2006.01)
  *B23K 3/00* (2006.01)
  *H05K 3/34* (2006.01)
  *H05K 1/11* (2006.01)

(52) U.S. Cl.
  CPC ........... *H05K 3/3436* (2013.01); *H05K 1/111* (2013.01); *H05K 3/3494* (2013.01); *H05K 2203/0405* (2013.01); *H05K 2203/0465* (2013.01)

(58) Field of Classification Search
  CPC .............. B23K 2101/40; B23K 1/0016; B23K 3/0623; B23K 3/0638
  USPC ................................................ 228/56.3, 246
  See application file for complete search history.

(56) References Cited

U.S. PATENT DOCUMENTS

| 3,921,285 A | 11/1975 | Krall | |
| 4,705,205 A * | 11/1987 | Allen | B23K 3/06 228/180.22 |
| 5,328,660 A | 7/1994 | Gonya et al. | |
| 6,429,388 B1 * | 8/2002 | Interrante | B23K 35/262 174/261 |
| 6,785,148 B1 * | 8/2004 | Ishida | H05K 3/325 361/769 |
| 7,523,852 B2 * | 4/2009 | Buchwalter | B23K 35/26 228/246 |

FOREIGN PATENT DOCUMENTS

GB  2142568  1/1985

* cited by examiner

*Primary Examiner* — Erin B Saad
(74) *Attorney, Agent, or Firm* — Knobbe Martens Olson & Bear, LLP

(57) ABSTRACT

An improved solder column, having a solder core comprising a solder core material, an exoskeleton sleeve structure surrounding at least a majority of an outside surface of the solder core and comprising a plurality of wires woven together to form a mesh, and a plurality of spaces formed in the exoskeleton between the plurality of wires. The exoskeleton sleeve can be configured such that the exoskeleton sleeve will support the solder core so as to prevent a collapse of the solder core at temperatures exceeding a liquidus temperature of the solder core. Optionally, each of the plurality of spaces can have a width and a height that is at least as large as a width of the wire adjacent to the space, and the spaces can be configured to provide additional flexibility to the solder column.

26 Claims, 10 Drawing Sheets

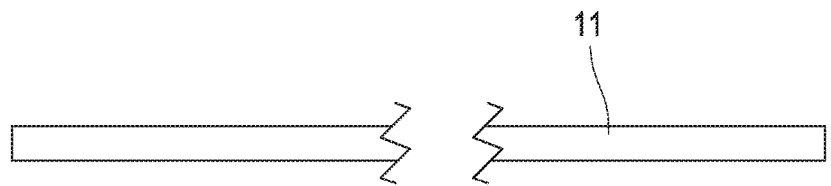
FIG. 9A
FIG. 9C
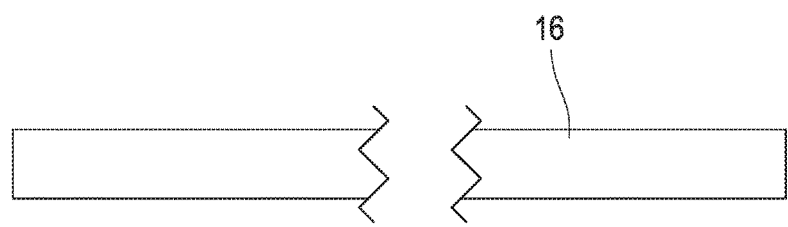
FIG. 9B
FIG. 9D
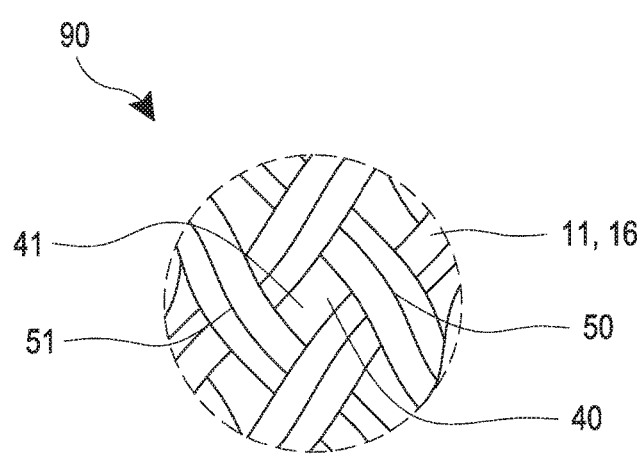
FIG. 10

| Material | | Approximate Temperature Range | | |
|---|---|---|---|---|
| Core | Hot Solder Bath Alloy | Hot Solder Bath Coating | Reflow Column to PCB using Solder Paste | Reflow Column to PCB using Tacky Flux |
| Lead Free SAC305, SAC405, SAC105, SAC125, SAC266, SN100C Sn96, and Others | Bi40/Sn60 | 170 ~190°C | SAC305 Paste 217 ~ 260°C | Without Paste 230 ~ 260°C |
| | Bi58/Sn42 | 138°C | | |
| | SAC305 SN100C | 217 ~ 260°C | | |
| High Content Lead Pb80/Sn20, Pb85/Sn15 Pb90/Sn10, Pb95/Sn5 Pb93.5/Sn5/Ag1.5 | Sn63/Pb37 Sn60/Pb40 | 183 ~ 220°C | Sn63/Pb37 Paste 183 ~ 230°C | Without Paste 280 ~ 315°C |
| | Sn62/Pb36/Ag2 | 179 ~ 220°C | | |
| | Pb93.5/Sn5/Ag1.5 | 296 ~ 330°C | Pb93.5/Sn5/Ag1.5 Paste 296 ~ 330°C | Without Paste 296 ~ 330°C |
| Low Content Lead Sn63/Pb37, Sn60/Pb40 Sn62/Pb36/Ag2 | Bi58/Sn42 | ~ 138°C | Sn63/Pb37 Paste 183 ~ 230°C | Without Paste 183 ~ 230°C |
| | Sn63/Pb37 | 183 ~ 220°C | | |
| | Sn62/Pb37/Ag2 | 179 ~ 220°C | | |
| Non-Solder Air-Core, Glass, ceramic, graphite, polyimide, PEEK | SAC305 | 217 ~ 260°C | SAC305 Paste 217 ~ 260°C | Not Applicable |
| Non-Solder Rubber, elastomer, plastic, fiber optic | Bi58/Sn42 | ~ 138°C | Bi58/Sn42 Paste ~ 138°C | Not Applicable |

FIG. 11

SOLDER COLUMNS AND METHODS FOR MAKING SAME

INCORPORATED BY REFERENCE TO ANY PRIORITY APPLICATIONS

The present application claims priority from U.S. Patent Application No. 62/835,322, filed on Apr. 17, 2019, titled SOLDER COLUMNS AND METHODS FOR MAKING SAME, the content of which is incorporated by reference herein in its entirety. The benefit of priority is claimed under the appropriate legal basis including, without limitation, under 35 U.S.C. § 119(e).

BACKGROUND

Field

Arrangements of the present disclosure relate generally to solder column structures and methods for making solder column structures.

Description of the Related Art

Typically, intermetallic connections are formed between a plurality of solder columns and the conductive pads on a land grid array (LGA) substrate. Initially, a layer of solder paste is applied to cover the array of conductive pads on the LGA. After heating, the solder paste reflows on the conductive pads causing an intermetallic connection between the solder columns and the conductive pads on the LGA. The LGA substrate material may consist of ceramic, plastic or silicon materials. After completion of the reflow process, the LGA with solder columns is known in the art as a column grid array (CGA) or ceramic column grid array (CCGA). In general, the number of solder columns on a CGA device may range from 4 to 10,000, or more, as the density of electronic devices and integrated circuit packages continues to increase.

An alternative to CGA column grid array devices is ball grid array (BGA) devices. BGA devices contain an array of solder spheres (balls) to provide electrical connections between the conductive pads on a BGA substrate and the printed circuit board (PCB). In the art, BGA substrates that are constructed of ceramic material (such as alumina or $Al_2O_3$) are known as a ceramic ball grid array (CBGA). Ceramic substrates are often required in harsh environments or when excessive heat and power is present.

However, one potential problem with BGA devices is that a substantial difference in the coefficient of thermal expansion (CTE) can exist between BGA substrates and the PCB board. The potential problem with CTE differences typically becomes more problematic when large size BGA substrates are attached to PCB boards that are made of plastic glass-woven material such as FR-4 or other laminate materials. Such differences in the coefficient of thermal expansion can cause deformation of the solder spheres (solder balls) interconnecting a BGA device to a PCB board. Over time, the electrical connection between the solder ball and metal pad can break between large size BGA substrates and a plastic glass-woven PCB due to CTE mismatching issues.

The problem with CTE mismatch has been addressed by using cylindrical solder columns instead of solder spheres (solder balls) as the electrical interconnect between module substrates and PCB boards. Traditionally, solder columns that tend to be used in applications in the military, aerospace and defense fields are cylindrically shaped and typically have a diameter of approximately 0.50 mm (0.020 inch) and a height of approximately 2.2 mm (0.087 inch). However, solder columns used in fields of high power computer servers, artificial intelligence (Ai), 5G wireless communications and micro-electronics in general, may be as small as 0.10 mm (0.004 inch) in diameter or more than 0.889 mm (0.035 inch) in diameter. Furthermore, the length of solder columns may be as short as 0.15 mm (0.006 inch) or as long as 3.81 mm (0.150 inch) or more.

The conductive pads on the LGA substrate are typically covered with a controlled thickness of solder paste before attaching a plurality of solder columns to the LGA substrate. In some cases, solder paste consisting of tin-lead alloy, such as Sn63/Pb37, may be preferred for applications within the fields of aerospace, military and defense industries. However, in commercial fields, lead free solder paste alloys such as SAC305 (Sn96.5/Ag3.0/Cu0.5), or other Pb-free alloys containing Bismuth (Bi), Indium (In) and other additives, may be used for applications requiring lead-free materials. Another alternative to solder columns are micro-coil springs that are typically made of beryllium copper (Be—Cu) alloy and electroplated with tin-lead solder (Sn60/Pb40) or other plating such as nickel-gold (Ni—Au).

Solder columns are generally vertically positioned perpendicularly onto a corresponding array of conductive pads on the LGA substrate. The substrate, together with high temperature solder columns, or alternative pins and a layer of low temperature solder paste are typically then heated so that the solder paste is reflowed to make an intermetallic fillet connection between the solder columns and the LGA conductive pads, without melting or damaging the solder columns. The completed package with attached solder columns is known in the art as a column grid array (CGA) or ceramic column grid array (CCGA) package.

A secondary procedure is typically required to mount the CGA package onto the PCB board. The process of connecting the CGA package to the PCB board requires the CGA to be reflowed again, without melting or collapsing the solder columns. A controlled layer of low temperature melting solder paste can be applied to a corresponding plurality of contact pads on the PCB board. The CGA package can be placed onto the solder paste covered pads on the PCB board. The PCB board along with one or a plurality of CGA packages (as well as other components) can then be heated and reflowed, which can result in an intermetallic fillet that holds the CGA solder columns to the PCB board.

Conventional processes have put a focus on avoiding collapse of the vertically positioned column(s) during the reflow process by selecting column materials with higher melting points compared to the onset of melting of the solder paste that wets and joins the column to the metal pads on the CGA package to the PCB boards.

However to date, little or no attention has been focused on developing solutions that can rapidly conduct and transfer heat from the underside of powerful, heat generating CGA packages. Rather, in conventional designs, typically heat sinks are mounted to the top side of CGA packages as a remedy to conduct heat away from the CGA Therefore, a better solution to solder columns must be developed to overcome each of these drawbacks and limitations. In particular, a more robust and reliable method and structure for maintaining the columnar shape and structural integrity of the solder column is needed. Furthermore, there is a need for a compliant sleeve structure for absorbing mechanical stresses caused by CTE mismatch, conducting electrical signals with a minimum of distortion and thermally conducting heat away from the underside of the CGA substrate through the column structure into ground layers of a printed circuit board using lead free materials. The arrangements of the present disclosure provide solutions to the aforementioned needs. The details of such arrangements will be described in greater detail below.

SUMMARY OF SOME NON-LIMITING ARRANGEMENTS

Disclosed herein are arrangements of solder column structures that can be configured to avoid catastrophic collapse of the column grid array (CGA) during reflow, and methods of making such structures. Any of the solder column arrangements disclosed herein can have exoskeleton sleeves with greater area coverage that can conduct more heat through the column from the underside of the CGA substrate to the ground layers of the printed circuit board.

Some arrangements of the improved solder columns disclosed herein are configured to provide a mechanically compliant, electrically conductive, and thermally conductive structure for use as an interconnection when joining semiconductor modules to printed circuit boards. In any arrangements, the solid solder core can be surrounded by an exoskeleton sleeve comprising 4 to 48 small-diameter copper wires joined together by electro-plating and coating the entire structure with a wettable solder alloy. During reflow at normal soldering temperatures, the ends of the column can liquefy without the solder column collapsing. This can form a diffused intermetallic connection with the solder paste wetted on the metallic pads of the module and secondarily to the metallic pads on the printed circuit board. Any solder column arrangements disclosed herein can also be made of or include lead-bearing materials. The solder columns disclosed herein can also provide attachment of the columns to LGA/CGA packages and to a printed circuit board with or without the use of solder paste, optionally using only Tacky Flux.

Any of the solder column arrangements disclosed herein can have any or any combination of any of the components, features, or details of any of the following arrangements.

Arrangement 1: An improved solder column, having a solder core comprising a solder core material, an exoskeleton sleeve structure surrounding at least a majority of an outside surface of the solder core and comprising a plurality of wires woven together to form a mesh, and a plurality of spaces formed in the exoskeleton between the plurality of wires.

Arrangement 2: The solder column of arrangement 1, wherein the exoskeleton sleeve is configured such that the exoskeleton sleeve will support the solder core so as to prevent a collapse of the solder core at temperatures exceeding a liquidus temperature of the solder core.

Arrangement 3: The solder column of any one of the previous arrangements, wherein each of the plurality of spaces has a width and a height that is at least as large as a width of the wire adjacent to the space.

Arrangement 4: The solder column of any one of the previous arrangements, wherein the spaces are configured to provide additional flexibility to the solder column.

Arrangement 5: The solder column of any one of the previous arrangements, wherein the plurality of wires form a diamond pattern about the exoskeleton.

Arrangement 6: The solder column of any one of the previous arrangements, wherein the plurality of wires each has a width from approximately 0.025 mm (0.001 inch) to approximately 0.076 mm (0.003 inch).

Arrangement 7: The solder column of any one of the previous arrangements, wherein the spaces each has a width and a height from approximately 0.050 mm (0.002 inch) to approximately 0.125 mm (0.005 inch).

Arrangement 8: The solder column of any one of the previous arrangements, wherein the spaces each have a width and a height from approximately 0.050 mm (0.002 inch) to approximately 0.125 mm (0.005 inch) and wherein a total surface area of the spaces is from approximately 10% to approximately 20% of a total surface area of the exoskeleton sleeve.

Arrangement 9: The solder column of any one of the previous arrangements, wherein the spaces each have a width from approximately 2 wire widths/diameters to approximately 4 wire widths/diameters and a height from approximately 2 wire widths/diameter to approximately 4 wire widths/diameters.

Arrangement 10: The solder column of any one of the previous arrangements, wherein the exoskeleton sleeve comprises a first wire that intersects and passes over or under a second wire at an angle that is from approximately 80° to approximately 100° relative to the second wire.

Arrangement 11: The solder column of any one of the previous arrangements, wherein the exoskeleton sleeve comprises a first wire that intersects and passes over or under a second wire at an approximately 90° angle.

Arrangement 12: The solder column of any one of the previous arrangements, wherein the wires of the plurality of wires each intersects and passes over or under other wires of the plurality of wires at an approximately 90° angle.

Arrangement 13: The solder column of any one of the previous arrangements, wherein the wires of the plurality of wires each intersects and passes over or under other wires of the plurality of wires at an angle that is from approximately 80° to approximately 100° relative to the other wires of the plurality of wires.

Arrangement 14: The solder column of any one of the previous arrangements, wherein the solder column is configured such that the solder core material will form a bond with conductive pads of an LGA/CGA and/or a printed circuit board without the solder core collapsing when the solder core material is in a molten state.

Arrangement 15: The solder column of any one of the previous arrangements, wherein the exoskeleton sleeve is further configured to improve a conduction of heat through the solder column.

Arrangement 16: The solder column of any one of the previous arrangements, wherein the solder column is configured such that solder from the solder core will form a bond with conductive pads of an LGA/CGA and/or a printed circuit board without a use of a solder paste when the temperature of the solder core exceeds the liquidus temperature of the solder core.

Arrangement 17: The solder column of any one of the previous arrangements, wherein at least a portion of a thickness of the exoskeleton sleeve is embedded into the solder core.

Arrangement 18: The solder column of any one of the previous arrangements, wherein the exoskeleton sleeve comprises 4, 8, 12, 16, 20, 24, 32, or 48 strands of wire.

Arrangement 19: The solder column of any one of the previous arrangements, wherein one or more of the wires comprises at least one of copper, beryllium-copper, silver and gold.

Arrangement 20: The solder column of any one of the previous arrangements, wherein one or more of the wires comprises palladium coated copper.

Arrangement 21: The solder column of any one of the previous arrangements, wherein one or more of the wires has a rectangular cross-section.

Arrangement 22: The solder column of any one of the previous arrangements, wherein one or more of the wires has a rectangular cross-section having a thickness in a radial direction of the exoskeleton sleeve of approximately 0.050 mm (0.002 inch) or less and a width of approximately 0.200 mm (0.008 inch) or less.

Arrangement 23: The solder column of any one of the previous arrangements, wherein the exoskeleton sleeve surrounds an entire length of the solder core.

Arrangement 24: The solder column of any one of the previous arrangements, wherein the plurality of spaces are partially or fully filled with solder.

Arrangement 25: The solder column of any one of the previous arrangements, wherein the exoskeleton sleeve comprises a plurality of electroplated joints between plurality of wires.

Arrangement 26: The solder column of any one of the previous arrangements, wherein up to approximately 50% of a thickness of the exoskeleton can embed into the solder core when a temperature of the solder core is above the liquidus temperature of the solder core.

Arrangement 27: An electronic system, comprising one or more printed circuit boards with a plurality of solder columns of any one of the previous arrangements.

Arrangement 28: A printed circuit board with a plurality of solder columns of any one of the previous arrangements coupled with the printed circuit board.

Arrangement 29: A land grid array comprising a plurality of solder columns of any one of the previous arrangements.

Arrangement 30: A ceramic column grid array comprising a plurality of solder columns of any one of the previous arrangements.

Arrangement 31: A solder column, having a solder core having a solder core material, an exoskeleton sleeve structure surrounding at least a portion of the solder core and comprising a plurality of wires woven together to form a mesh, and a plurality of spaces formed in the exoskeleton between the plurality of wires.

Arrangement 32: The solder column of arrangement 27, wherein the plurality of wires has a plurality of wire pairs each comprising a first wire and a second wire, the second wire being adjacent to the first wire along an entire length of the first wire.

Arrangement 33: The solder column of any one of arrangements 27-28, wherein the exoskeleton sleeve is configured to support the solder core, particularly at elevated temperatures exceeding a liquidus temperature of the solder core, and to improve the heat conduction of the solder column.

Arrangement 34: The solder column of any one of arrangements 27-29, wherein the spaces are configured to provide additional flexibility to the solder column to improve the ability of the solder column to absorb stresses caused by mismatches in the coefficient of thermal expansion between the substrates interconnected by the solder column.

BRIEF DESCRIPTION OF THE DRAWINGS

FIG. 9A is a partial side view of an arrangement of a single strand of round wire that can be used in any arrangements of the exoskeleton sleeves disclosed herein, including without limitation the exoskeleton sleeve arrangement shown in FIG. 1.

FIG. 9B is a partial side view of an arrangement of a single strand of flat wire (that can have a rectangular or square cross section, with or without corner radiuses) that can be used in any arrangements of the exoskeleton sleeves disclosed herein, including without limitation the exoskeleton sleeve arrangement shown in FIG. 1.

FIG. 9C is an end view of the arrangement of the strand of wire shown in FIG. 9A.

FIG. 9D is an end view of the arrangement of the strand of wire shown in FIG. 9B.

FIG. 10 is a partial detail view of an exoskeleton sleeve comprising a wire braid or mesh of overlapping wire strands that can comprise any arrangements of the wire strands disclosed herein or any combination of wire strands disclosed herein, including without limitation the wire strands shown in FIG. 9A and/or FIG. 9B.

FIG. 11 illustrates a table of optional materials and approximate temperature ranges of such materials that can be used to make and/or coat any arrangements of the solder column and/or exoskeleton disclosed herein.

DETAILED DESCRIPTION

Figure 1:
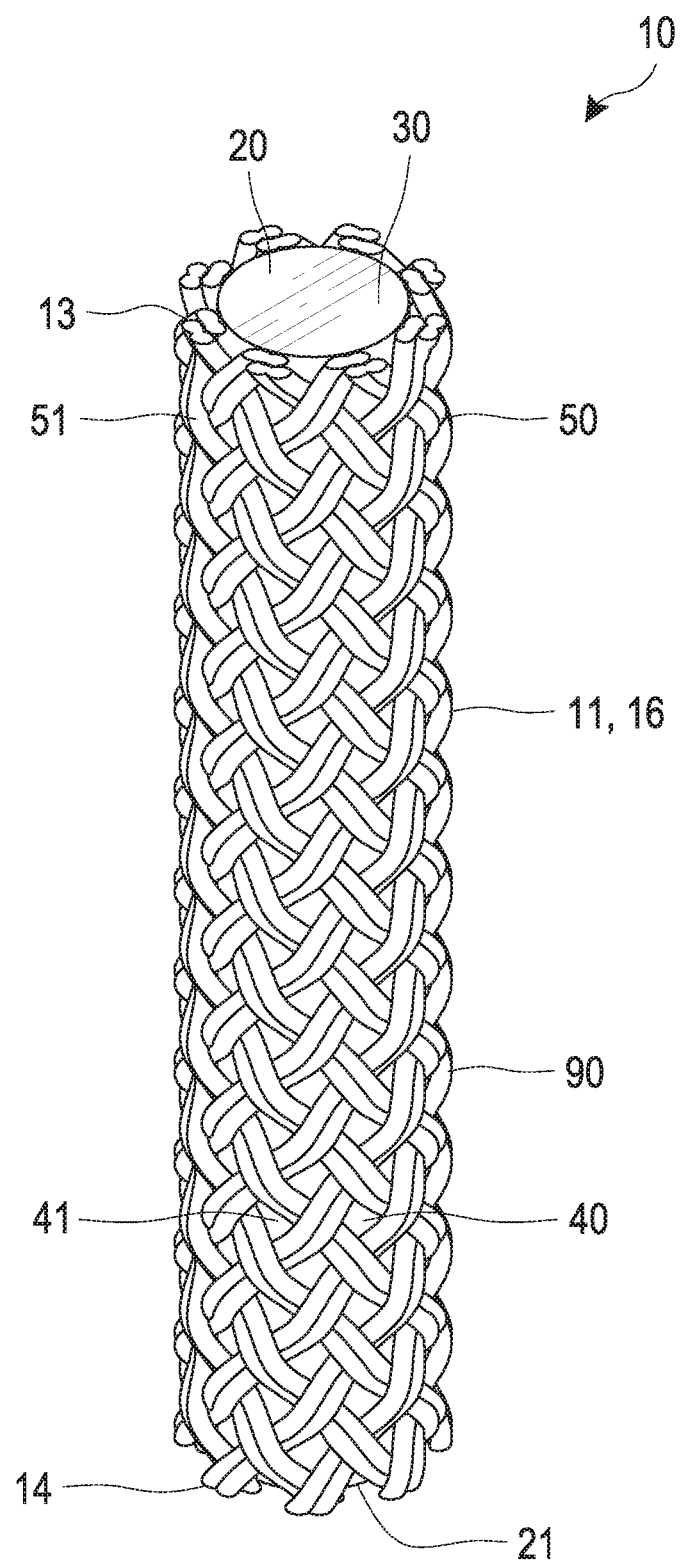
FIG. 1 is a perspective view of an arrangement of a solder column surrounded by an exoskeleton sleeve comprising a plurality of round or flat wires.

Disclosed herein are arrangements of improved solder columns and methods for making improved solder columns.

The improved solder columns or solder column structures disclosed herein can absorb mechanical stress(es) caused by differences in the coefficients of thermal expansion of mating or abutting materials or components that pass electrical signals and conducting heat between column grid array (CGA) integrated circuit modules used in computer servers. The improved solder columns or solder column structures disclosed herein can also provide an interconnect in an array pattern on ceramic, organic or silicon substrates when joining micro-electronic packages to corresponding metal pads on printed circuit boards. Any arrangements disclosed herein can be configured such that the solder columns can bond to the metal pads on the LGA and printed circuit board by using Tacky Flux™ without the need for solder paste during reflow.

The first attachment of the solder column is normally to the conductive (metalized) pads on the LGA component housing substrate, module, silicon die or silicon wafer, generally known in the art as the "First Level" (or Level 1) attachment. After the First Level attachment is completed, then days, weeks, months or even years later, the CGA electronic component housing substrate (together with previously mounted solder columns), is attached the PCB Board. This is known in the art as the "Secondary Level" (or Level 2) attachment. During the Secondary Level attachment, the solder in and around the columns temporarily liquefies (reflows) again. After cooling down and solidifying, one end of the column is welded to the CGA substrate and the other end of the column is welded to the PCB board. The above describes a typical two step soldering process of attaching columns.

The solder column structures disclosed herein can also be simultaneously attached to the CGA substrate and to the PCB board substrate during the same heating and welding operation using Tacky Flux. The benefit of simultaneously attaching the solder columns to the CCGA substrate and to the PCB board substrate provides more reliability since temperature sensitive components can experience just one heat-shock cycle during the same welding reflow process, rather than two separate reflow cycles described in Level 1 and Level 2 soldering operations.

The solder column structures disclosed herein can achieve improved performance using improved materials and alloys, as described below. Any solder column structures or components thereof disclosed herein can be made using lead free or lead containing materials, including, without limitation, any of the alloys or materials shown in the table of FIG. 11. Any of the materials shown in FIG. 11 can be used alone or in combination with the other materials of the table of FIG. 11. Additionally, any solder columns disclosed herein or components thereof can comprise alloys known in the art as SAC305 (Sn96.5/Ag3.0/Cu0.5), SAC405 (Sn95.5/Ag4.0/Cu0.5), SAC105 (Sn98.25/Ag1.0/Cu0.5), SAC125 (Sn98.3/Ag1.2/Cu0.5), SN100C (Sn99.2/Cu0.7/Ni0.05/Ge<0.01), SAC266 (Sn95.8/Ag2.6/Cu0.6), Sn96 (Sn96.5/Ag3.5) and/or any combination of the foregoing. Additionally or alternatively, the solder column can include other available alloys comprising or consisting of any combination of tin (Sn) approximately over 95% by weight, silver (Ag) less than approximately 5% by weight, copper (Cu) less than approximately 1% by weight and alternatively other additives or dopants such as nickel, germanium, gallium, bismuth, indium, antimony or palladium (Pd). Any arrangements disclosed herein can also comprise any combination of alloys of lead (Pb) over 80% by weight and tin (Sn) remainder (balance) by weight for example, without limitation Pb90/Sn10, Pb85/Sn15, Pb80/Sn20, Pb93.5/Sn5/Ag1.5, and other similar materials or alloys. In any arrangements, the solder column or any portion or components thereof can comprise SAC305, Sn63/Pb37, Pb80/Sn20, Pb90/Sn10 and/or Pb93.5/Sn5/Ag1.5.

Furthermore, any solder column arrangements disclosed herein can optionally have any combination of alloys of lead (Pb), which can, optionally, be less than 40% by weight, and tin (Sn), which can, optionally, comprise the remainder (balance) of the material by weight. Non-limiting examples include Sn63/Pb37, Sn60/Pb40, or Sn62/Pb36/Ag2 with approximately 2% silver (Ag), and other similar materials or alloys. Any arrangements disclosed herein can also comprise any combination of glass, plastic, rubber, paper, ceramic, graphite, glass fiber optic cable, polyimide (known as brand name Kapton), polyetheretherketone (known in the art as PEEK) and/or elastomer.

Any solder column arrangements disclosed herein can have an improved exoskeleton sleeve that can be configured to increase the strength and integrity of the solder columns, so that the solder columns can retain sufficient mechanical, electrical and thermal integrity without collapsing, during reflow of the columns to the LGA, and secondarily when the CGA substrate is reflowed to the printed circuit board. Further, the exoskeleton sleeve structures disclosed herein can optionally be configured to absorb mechanical stresses caused by coefficient of thermal expansion (CTE) mismatch, to conduct electrical signals with minimum of distortion, and to thermally conduct heat away from the underside of the CGA substrate through the exoskeleton column structure into ground layers of the printed circuit board. As described, such components can be made from lead containing or lead free materials.

Some arrangements disclosed herein comprise an exoskeleton sleeve structure integrated with the solder columns configured to avoid catastrophic collapse of the LGA/CGA during reflow. Some solder column arrangements disclosed herein are configured to achieve known (e.g., measured) controlled collapse during reflow.

The exoskeleton sleeve of any arrangements disclosed herein can be configured to allow the column core to be comprised of readily accessible alloys (commonly available in solder balls) which can be reflowed to bond the LGA/CGA to the printed circuit board through a column structure without consequences of column collapsing as the temperature exceeds the liquidus temperature of the solder core material. Non-collapsible columns avoid changes in impedance and operating frequency (detuning) issues commonly encountered when the spacing between the LGA substrate and the printed circuit board is altered. Additionally some arrangements disclosed herein are directed to methods and devices for constructing an exoskeleton sleeve structure that is joined into the surface of the skin of the solder columns (reducing resistance build up caused by oxidization and contamination between the exoskeleton and the core) and methods for constructing solder columns with exoskeleton sleeves to electrically join and bond the CGA to the PCB Board using solder paste during reflow with maximum conductivity and minimum electrical resistance between the LGA/CGA and the printed circuit board.

For example and without limitation, FIG. 1 shows an arrangement of a solder column 10 of the present disclosure surrounded by an exoskeleton sleeve comprising a plurality of round and/or flat wires. In any arrangements disclosed herein, the column 10 can comprise a core 30 surrounded by an exoskeleton sleeve 90 comprising a plurality of wire 11 (and/or 16), which can have a round cross-section, a flat or rectangular cross-section, a square cross-section, a polygonal cross-section, or any combination of different cross-sectional shapes, with or without corner radiuses. The exoskeleton sleeve or structure 90 can optionally comprise 4, 8, 12, 16, 20, 24, 32, 48 or more strands of wire, which can include copper, beryllium-copper, silver and/or gold round wires 11 and 15 shown in FIGS. 9A and 9C. The wire of any arrangements can have an approximately 0.05 mm (0.002 inch) or smaller diameter. In exoskeleton sleeve arrangements comprising flat wire 16, as shown in FIG. 9B, the exoskeleton sleeve 90 can comprise 4, 8, 12, 16, 20, 24, 32, 48 or more strands with thickness 17 shown in FIG. 9D less than approximately 0.0508 mm (0.002 inch) and a width less than approximately 0.204 mm (0.008 inch). The wire or strands can optionally have a flattened, round, rectangular, square, or other suitable cross-sectional shape, any having with sharp or rounded corners. Nonlimiting examples of arrangements of wires that can be used to form any arrangements of exoskeleton sleeves are shown in FIGS. 9A-9D. In any arrangements disclosed herein, the wire can be made of copper, beryllium-copper, silver, gold, or any other suitable material or combination or alloy thereof.

The configuration of multiple wires has significant benefits of arrangements having only one wire that is helically wrapped around an outside surface of the solder core, which single wire design can have significant drawbacks. For example, oxidation can form between a single strand of a helically wrapped wire parallel to the solder core, which can cause a decrease in electrical and thermal conductivity performance over time. Additionally, a relatively long length of the single wire strand can result in a higher amount of electrical resistance and poorer thermal conductivity in the solder column.

Taller cylindrically shaped solder columns can generally be more compliant to better absorb CTE differential thermal expansion rates between the CGA and the PCB board. Accordingly, because of the increased robustness of some arrangements disclosed herein, any arrangements can have increased heights as compared to conventional solder columns. Any solder column arrangements disclosed herein can have any suitable or desired height. Optionally, the solder columns can have a height of approximately 2.2 mm (0.087 inch), or from approximately 1.0 mm (0.039 inch) or less to approximately 3.8 mm (0.150 inch) or more. Columns can be configured to be more structurally robust to support the load weight of heavy, large CGA substrates. The diameter of the solder column can be constrained by the pitch (spacing) of the conductive pads on the CGA package as well as by the diameter of the conductive pads on the PCB boards.

The exoskeleton mesh or sleeve can be braided in different combinations depending on how many total wires are used. Half-load patterns, wherein the braiding machine is configured to run at 50% capacity with 8 strands allows a single wire alternately passing under then over another single wire, minimizing the additional thickness added by the wires 11 (or 16). Alternatively, full-load patterns, wherein the braiding machine is configured to run at 100% capacity with 16 strands, can be used which places one single wire under two wires, then over two wires rotated in opposite directions. Yet, another pattern with 32 strands, known in the art as a diamond pattern, places two wires side by side passing under two wires, then over two wires in the opposite direction. Such configurations can increase the effective thickness of metal in the exoskeleton, thereby allowing more heat to be conducted with lower electrical resistance from one end of the column to the other end, while minimizing the thickness of the exoskeleton layer.

In any arrangements disclosed herein, the structure or sleeve 90 can comprise one or more wires that are oriented at an angle that is approximately 45° relative to a longitudinal axis of the sleeve 90, or from approximately 30° to approximately 60° or more relative to a longitudinal axis of the sleeve 90. In the arrangement illustrated in FIG. 10, the mesh comprises a plurality of wire pairs comprising two wires 11 (or 16) that can be adjacent to each other along an entire length of the wire pair. The exoskeleton sleeves of any arrangements disclosed herein can comprise a first wire that intersects with and passes over or under a second wire at an angle that is approximately 90° relative to the second wire, or from approximately 70° or less to approximately 110° or more relative to the second wire, or from approximately 80° to approximately 100° relative to the second wire. Any arrangements can have a plurality of wires that intersect and pass over or under other wires at an angle that is approximately 90° relative to the intersecting wires, or from approximately 70° or less to approximately 110° or more relative to the intersecting wires, or from approximately 80° to approximately 100° relative to the intersecting wires.

Two or more overlapping junctions 50 form a plurality of overlapping junctions 51. A full joint electrical and mechanical connection can be formed at 51 by electroplating and/or immersing the column structure into a molten bath of liquefied solder. During immersion into a hot molten solder bath, the open spaces 40 can be partially and/or fully filled with a measured volume of solder material. The lead free hot solder bath can liquefy at temperatures ranging between approximately 170° C. and approximately 190° C. when the hot solder bath comprises approximately 38% to approximately 42% bismuth (Bi) by weight and approximately 58% to approximately 62% tin (Sn) by weight which can include additives to reduce Sn/Bi brittleness and to optimize malleability resulting in a ductile column that can survive an increasing number of drop-shock test cycles.

Alternatively, the lead free hot solder bath can liquefy at temperatures approximately 138° C. when the hot solder bath comprises approximately 58% bismuth (Bi) by weight and approximately 42% tin (Sn) by weight which can include additives to reduce Sn/Bi brittleness and to optimize malleability resulting in a ductile column that can survive an increasing number of drop-shock test cycles. Alternatively, the lead free hot solder bath can liquefy at temperatures approximately 217° C. to 260° C. when the hot solder bath comprises SAC305 or SN100C which can include additives to optimize malleability resulting in a ductile column that can survive an increasing number of drop-shock test cycles. A lead bearing molten solder bath optimally can comprise eutectic Sn63/Pb37 with molten temperatures between approximately 183° C. to approximately 220° C. Alternatively, other lead bearing molten solder bath can comprise non-eutectic Sn62/Pb36/Ag2.0 with molten temperatures between approximately 179° C. to approximately 220° C. Further, high temperature lead bearing molten solder bath can optimally comprise high melt point (HMP) solder such as Pb93.5/Sn5/Ag1.5 or Pb90/Sn10, etc. with molten temperatures between 296° C. to 330° C.

Figure 2:
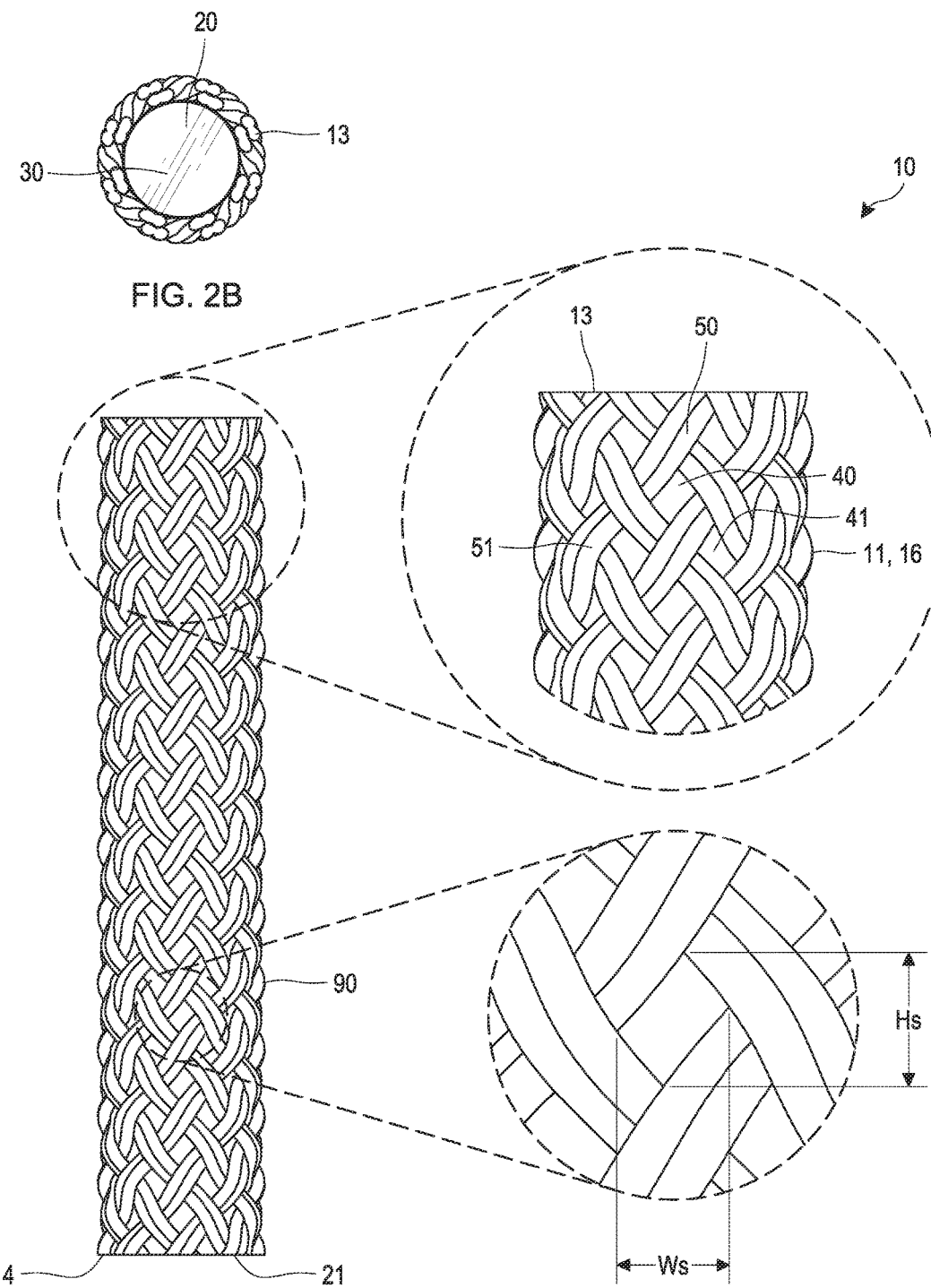
FIG. 2A is a side view of the solder column and exoskeleton sleeve arrangement shown in FIG. 1 showing the solder column and exoskeleton sleeve arrangement after the solder column and exoskeleton sleeve arrangement has been electroplated and/or immersion coated in a molten solder bath.
FIG. 2B is a top view of the solder column and exoskeleton sleeve arrangement of FIG. 2A.

FIG. 2A shows an arrangement of a solder column 10 of the present disclosure with an enlarged view that better shows the detail of the pattern and structure of an arrangement of an exoskeleton sleeve 90. The sleeve can comprise a plurality of 4, 8, 12, 16, 20, 24, 32, 48 or more strands of round wire 11, or alternatively flat wire 16 or any combination of the wire types disclosed herein. A junction 50 can be formed in exoskeleton structure 90, when wire 11 (or 16) overlaps and intersects with another wire 11 (or 16). Two or more open spaces 40 forms a plurality of open spaces 41. During immersion into a hot molten solder bath, the open spaces 41 will be fully filled and/or partially filled with a measured volume of material. The free ends of the wire 11 (or 16) are designated as 13 in FIGS. 2A, 2B, and 3. The flat end at the top limit of the column is designated as 20 in FIG. 2B. The flat end of the bottom limit of the column is designated as 21 in FIG. 2A. In some arrangements, the sizes of the spaces can be optimized to ensure proper wetting of the solder at or adjacent to the spaces 41 and to permit air bubbles that may form or exist within the molt solder to pass and escape through the spaces, to avoid or minimize voids in the solder.

In any arrangements disclosed herein, each of the spaces 40 can be optimally sized to provide the benefits mentioned above, without being so large that solder core material (or a substantial amount of solder core material) from the solder core leaks or passes through the spaces when the solder core material is in a molten or liquid state. Optionally, the spaces 40 of any arrangements disclosed herein can have a width (as indicated by Ws in FIG. 2A) and/or a height (as indicated by Hs in FIG. 2A) of approximately 0.025 mm (0.001 inch) or less to approximately 0.125 mm (0.005 inch) or more. Optionally, the spaces 40 of any arrangements disclosed herein can have a width Ws and/or a height Hs that is from approximately 1 wire diameter/width or less to approximately 5 wire diameters/widths or more, or between any values within these ranges. The height Hs can be greater than, equal to, or less than the width Ws in any arrangements.

Additionally or alternatively, a total combined area of the plurality of spaces 41 in any arrangements disclosed herein can be approximately 10% to approximately 20%, of the total surface area of the exoskeleton sleeve 90, or between any values within these ranges. Any arrangements of the exoskeleton sleeves disclosed herein can have any of the sizes or size ranges disclosed herein in combination with any of the total surface area values or ranges disclosed herein.

Figure 3:
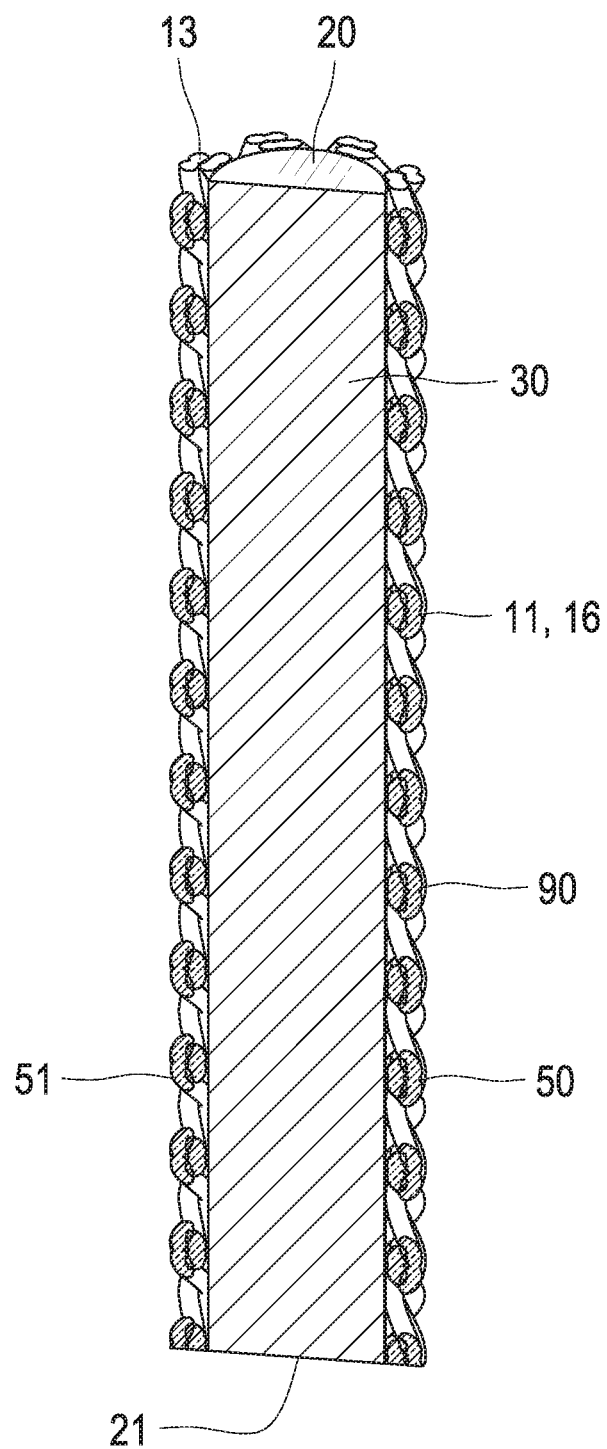
FIG. 3 is a cross-sectional perspective side view of the solder column and exoskeleton sleeve arrangement of FIG. 1.

FIG. 3 is a section view of the arrangement of the sleeve of FIG. 2A with core 30 surrounded by exoskeleton 90. Overlapping joints 51 can be bonded by electroplating and/or immersing the column structure into a liquefied bath of molten solder.

Figure 4B:
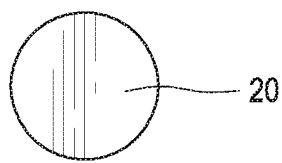
FIG. 4B is top view of the arrangement of the cylindrical solder core shown in FIG. 4A.
Figure 4A:
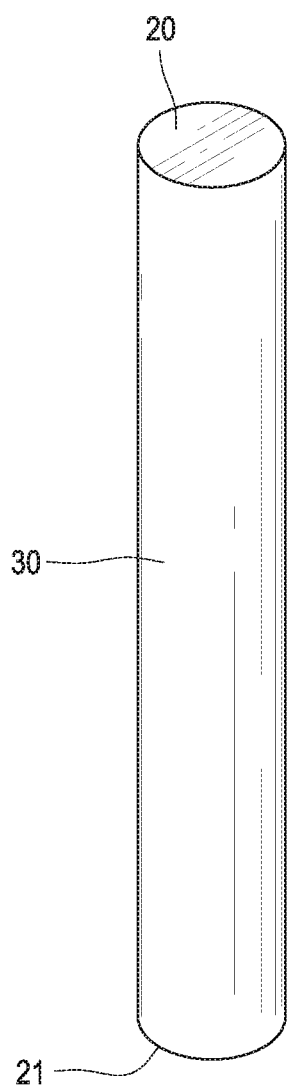
FIG. 4A is a perspective view of an arrangement of a cylindrical solder core (which can alternatively be made of other materials) without an exoskeleton sleeve.
Figure 4C:
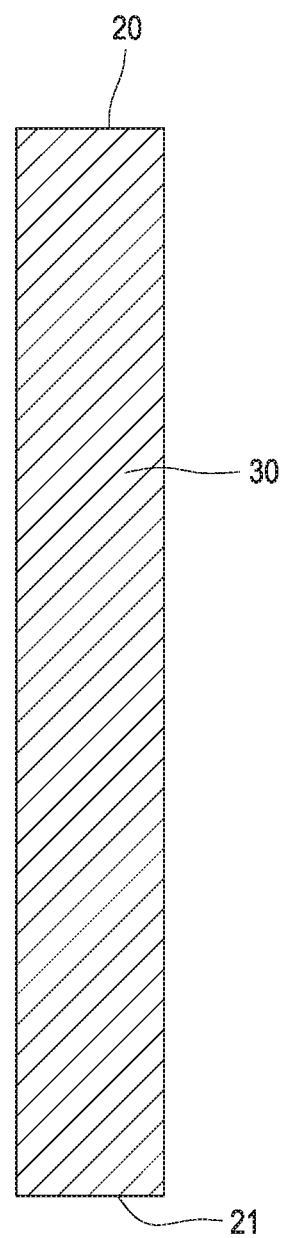
FIG. 4C is a front facing cross-sectional view of the cylindrical solder core shown in FIG. 4A.

FIG. 4A is perspective view of an arrangement of a core 30 without an exoskeleton structure. FIG. 4B is a top view 20 of the cylindrically shaped core 30. FIG. 4C is a front facing view of FIG. 4A. In any arrangements disclosed herein, the core 30 may comprise any of a range of lead free conductive alloys such as, but not limited to, SAC305 (Sn96.5/Ag3.0/Cu0.5), SAC405 (Sn95.5/Ag4.0/Cu0.5), SAC105 (Sn98.25/Ag1.0/Cu0.5), SAC125 (Sn98.3/Ag1.2/Cu0.5), SN100C (Sn99.2/Cu0.7/Ni0.05/Ge<0.01), SAC266 (Sn95.8/Ag2.6/Cu0.6), Sn96 (Sn96.5/Ag3.5), and/or any combination of tin (Sn) over approximately 95% by weight, silver (Ag) approximately less than 5% by weight, copper (Cu) less than approximately 1% by weight and alternatively other additives or dopants such as nickel, germanium, gallium, bismuth, indium or antimony.

Alternatively, any arrangements of the core 30 can comprise a high temperature melting lead bearing solder alloy of any combination of lead (Pb) over approximately 80% by weight and tin (Sn) remainder (balance) by weight. (e.g., Pb90/Sn10, Pb85/Sn15, Pb80/Sn20, Pb93.5/Sn5/Ag1.5, etc.) Furthermore, any arrangements of the core 30 can comprise a low temperature melting lead bearing solder alloy of any combination of lead (Pb) less than approximately 40% by weight and tin (Sn) remainder (balance) by weight (e.g., Sn60/Pb40, Sn63/Pb37, Sn62/Pb36/Ag2.0, etc.) and alternatively other additives or dopants such as silver, bismuth, indium or antimony.

In addition, any arrangements of the core (such as, but not limited to core 30) can comprise of any combination of glass, plastic, rubber, paper, ceramic, graphite, glass fiber optic cable, polyimide (known as brand name Kapton), polyetheretherketone (known in the art as PEEK) and/or elastomer.

Figure 5A:
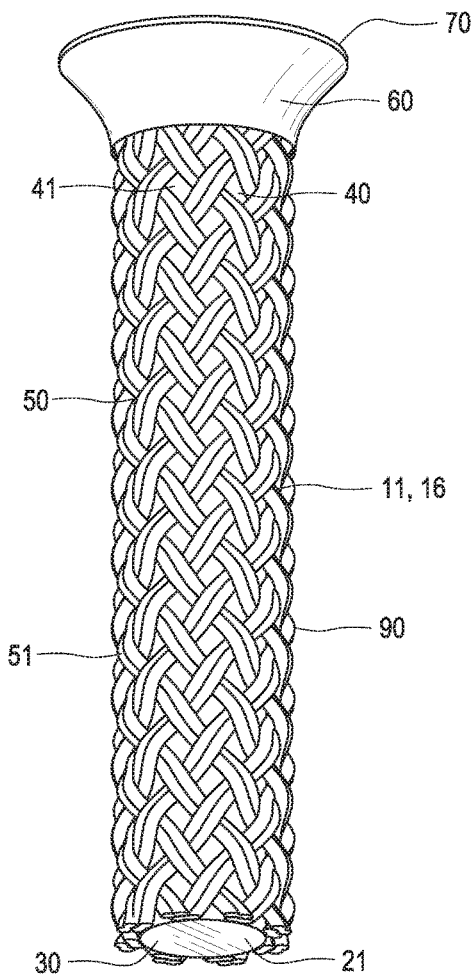
FIG. 5A is a perspective view of the solder column and exoskeleton sleeve arrangement shown in FIG. 1 after reflowing one end of the column to a conductive pad of a LGA/CGA substrate.

FIG. 5A is a perspective view of the solder column and exoskeleton sleeve arrangement shown in FIG. 1 with fillet 60 after reflowing and connecting one end of the column to a conductive pad on a LGA/CGA substrate. Fillet 60 can be formed by applying a controlled thickness of solder paste onto conductive pad 70, then reflowing the column structure above the liquidus temperature of the solder paste on pad 70.

Figure 5B:
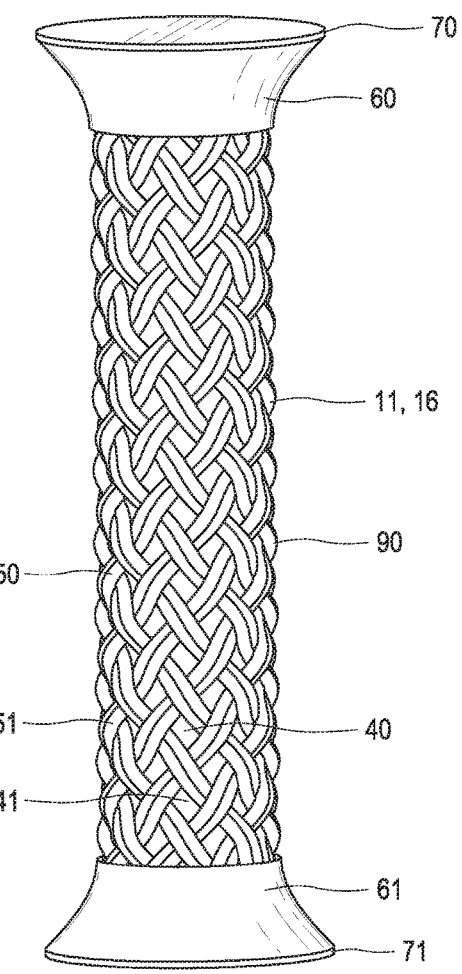
FIG. 5B is a perspective view of the solder column and exoskeleton sleeve arrangement shown in FIG. 5A after reflowing the other end of the column to a conductive pad on the printed circuit board.

FIG. 5B is a perspective view of the solder column and exoskeleton sleeve arrangement shown in FIG. 5A after reflowing the other end of the column to a conductive pad 71 on the printed circuit board with fillet 61 joining the column structure to the conductive land pad 71 on the printed circuit board. Fillet 61 can be formed by applying a controlled thickness of solder paste onto conductive pad 71, then reflowing the column structure above the liquidus temperature of the solder paste on pad 71.

Alternatively, fillets 60 and/or 61 can join the column structure comprising a solder core 30 to conductive pads 70 and/or 71 without using solder paste by means of applying commercially available Tacky Flux onto conductive pads 70 and/or 71 using normal stencil printing processes. After coating Tacky Flux to pads 60 and/or 61, and heating the LGA/CGA and/or PCB Board at an optimum temperature above the liquidus temperature of a solder material contained in core 30, then a controlled volume of solder will flow from the solder core material 30 onto pads 70 and/or 71 forming a fillet approximately the same way that of a BGA solder ball (consisting of same solder material as core 30) does at the same reflow temperature. During reflow, additional solder will flow from the spaces 41 due to capillary action and combine with the solder core 30 during the formation of fillet 60 and/or 61. During reflow, the arrangement of the exoskeleton sleeve 90 will retain its structural height and can continue supporting the LGA/CGA substrate at approximately the same distance from the printed circuit board as would occur if solder paste had been applied to conductive pads 70 and/or 71.

Figure 6A:
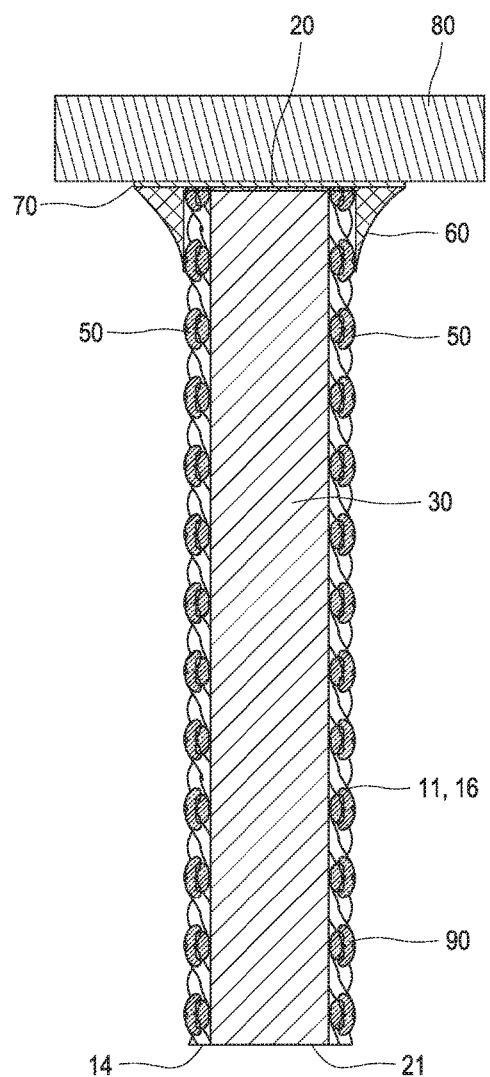
FIG. 6A is a cross-sectional view of the solder column and exoskeleton sleeve arrangement shown in FIG. 5A attached to a LGA/CGA substrate.
Figure 6B:
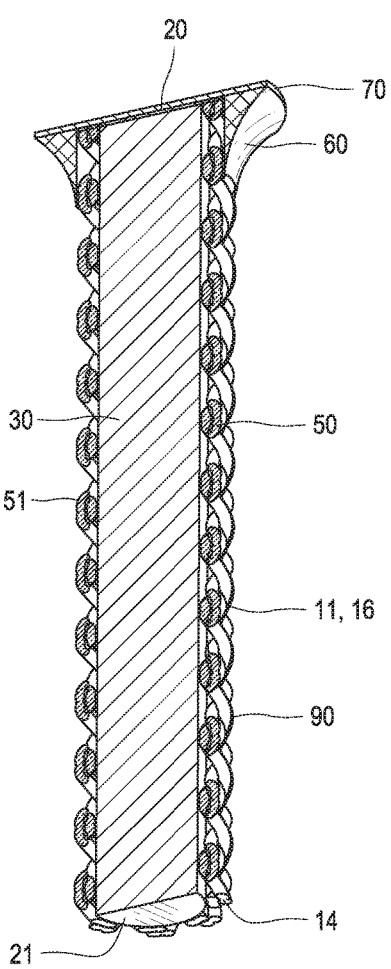
FIG. 6B is a perspective view of the cross-section of the solder columns and exoskeleton sleeve arrangement shown in FIG. 6A.

FIG. 6A is a cross-sectional view of the solder column and exoskeleton sleeve arrangement shown in FIG. 5A attached to a LGA/CGA substrate 80 shown in FIG. 6A. FIG. 6B (shown for clarity without LGA/CGA substrate 80) is a perspective view of the cross-section of the solder column and exoskeleton sleeve arrangement shown in FIG. 6A.

Figure 7A:
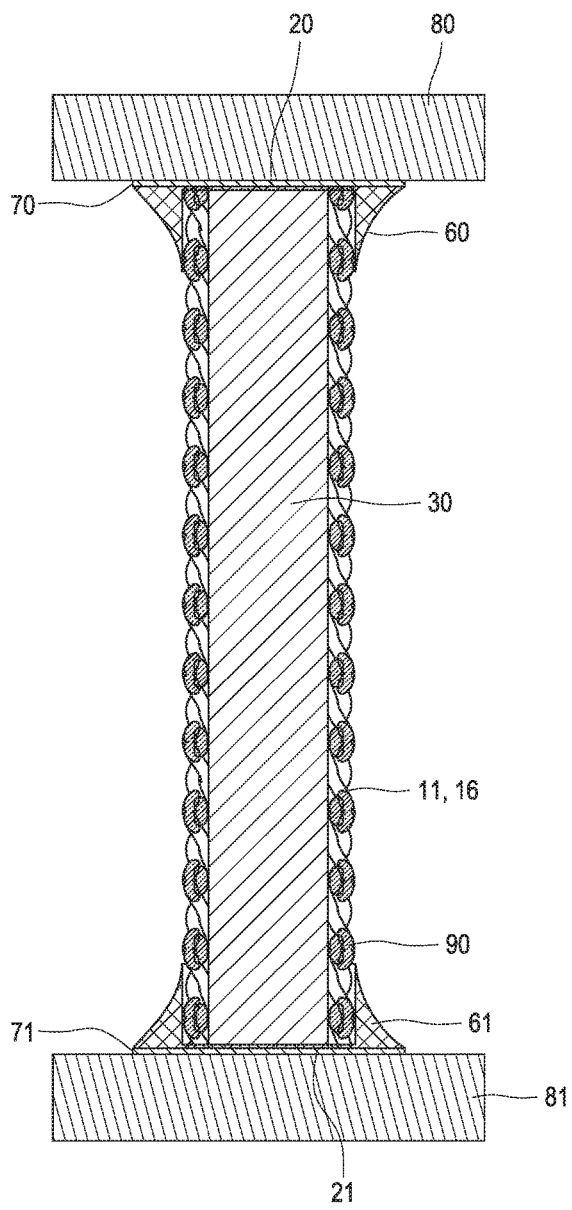
FIG. 7A is a cross-sectional view of the solder column and exoskeleton sleeve arrangement shown in FIG. 5B.
Figure 7B:
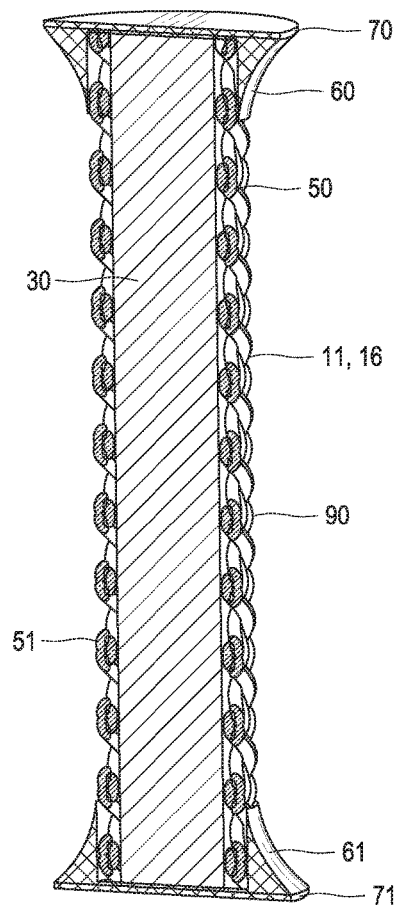
FIG. 7B is a perspective cross-sectional view of the cross-section of the solder column and exoskeleton sleeve arrangement shown in FIG. 7A.

FIG. 7A is a sectional view of the solder column and exoskeleton sleeve arrangement shown in FIG. 5B coupled with an LGA/CGA substrate 80 and a printed circuit board 81. FIG. 7B (shown for clarity without LGA/CGA 80 and without printed circuit board 81) is a perspective view of FIG. 7A. In FIG. 7A, the LGA/CGA substrate is shown as 80 and the printed circuit board is shown as 81.

FIG. 9A is a partial side view of an arrangement of a single strand of round wire 11 that can be used in any arrangements of the exoskeleton sleeves disclosed herein, including without limitation the exoskeleton sleeve arrangement shown in FIG. 1A. FIG. 9C is an end view of the arrangement of the strand of wire 11 shown in FIG. 9A. As described, the strand of wire 11 can have a generally round cross-section 15. In any other arrangements, the strand or wire 11 can have an ovular or elongated cross-section, or otherwise.

FIG. 9B is a partial side view of an arrangement of a single strand of flat wire 16 (that can have a rectangular or square cross section, with or without corner radiuses) that can be used in any arrangements of the exoskeleton sleeves disclosed herein, including without limitation the exoskeleton sleeve arrangement shown in FIG. 1. FIG. 9D is an end view of the arrangement of the strand of wire 16 shown in FIG. 9B.

FIG. 10 is a partial detail view of an exoskeleton sleeve comprising a wire braid or mesh of overlapping wire strands that can comprise any arrangements of the wire strands disclosed herein or any combination of the wire strands disclosed herein, including without limitation the wire strands shown in FIG. 9A and/or FIG. 9B. The sleeve of FIG. 10 can have overlapping junctions 50 and a plurality electroplated or immersion soldered joints 51 and open area 40 between the overlapping wires. Stress caused by CTE mismatch between the LGA/CGA substrate and PCB Board can be absorbed in the open spaces 41 together with the inherent elasticity of the solder column structure 10 resulting in prolonged operating life of the system.

Any solder column arrangements disclosed herein can have an exoskeleton sleeve comprising 4, 8, 12, 16, 20, 24, 32, 48 or more strands of copper, beryllium-copper, silver or gold round wires of approximately 0.05 mm (0.002 inch) or smaller diameter over any combination of the above mentioned core materials, including the air core arrangements disclosed herein. Additionally, any solder column arrangements disclosed herein can have an exoskeleton sleeve comprising 4, 8, 12, 16, 20, 24, 32, 48 or more strands of flattened copper, beryllium-copper, silver or gold over any combination of the above mentioned core materials, including air.

The strands in any of the foregoing arrangements can have, but are not required to have, a wire thickness less than approximately 0.051 mm (0.002 inch) and/or a width less than approximately 0.204 mm (0.008 inch). Optionally, the exoskeleton sleeve of any solder columns disclosed herein can have round or flattened copper (Cu) wire. The wire can be made of copper electroplated with less than approximately 2% by weight Palladium (Pd) and less than approximately 0.1% by weight Gold (Au), known in the art as palladium coated copper (PCC). Furthermore, in any arrangements disclosed herein, an exoskeleton sleeve can have any combination round or flattened wire having any combination of beryllium copper (Be—Cu), gold (Au) and silver (Ag).

The exoskeleton sleeves of any arrangements disclosed herein can have electroplated joints between the overlapping wire strands that can, among other things, reduce oxidation build up between intersecting strands of the sleeve and make the sleeve stronger. Such a configuration can conduct more heat through the column from the underside of the CGA substrate to the ground layers of the printed circuit board. The benefits of conducting more heat away from the CGA substrate can include, but are not limited to, extending the life to the silicon chip system housed in the CGA by operating at a lower temperature differential compared to ambient. In general, excessive heat can result in the shortened life of a silicon chip. Conducting heat from the bottom side of the CGA package through the exoskeleton sleeve of the column can potentially reduce the size, mass and weight of a heavy heat sink traditionally mounted on the top side of conventional CGA packages.

In some arrangements, the methods and apparatuses can comprise exoskeleton sleeves joined to tin (Sn) rich solder column cores (that can be lead free) using a hot solder immersion bath process at temperatures ranging approximately between 170° C. to 190° C. The hot solder bath comprise approximately of 38% to approximately 42% bismuth (Bi) by weight and approximately 58% to approximately 62% tin (Sn) by weight with additives to reduce Sn/Bi brittleness and to optimize malleability resulting in a ductile column that can survive an increasing number of drop-shock test cycles. In another arrangement the hot solder immersion bath process can be at approximately 138° C. with hot solder bath comprising approximately 58% bismuth (Bi) by weight and approximately 42% tin (Sn) by weight with additives to reduce Sn/Bi brittleness and to optimize malleability resulting in a ductile column that can survive an increasing number of drop-shock test cycles. In another arrangement, the hot solder immersion bath process can be at approximately between 217° C. to 260° C. with hot solder bath comprising SAC305 or SN100C with or without bismuth (Bi) and other additives to optimize malleability resulting in a ductile column that can survive an increasing number of drop-shock test cycles.

In accordance with another aspect of arrangements disclosed herein, approximately 0.007 mm to approximately 0.015 mm (0.0003~0.0006 inch) of molten SnBi alloy can cover the entire column with at least approximately 10% of the diameter of the exoskeleton partially embedding into the exterior skin of the solder core material during the hot tin-bismuth solder bath process. Subsequently, up to approximately 50% of the diameter or thickness of the exoskeleton can embed into the skin of the solder core during attachment of the column to the CGA substrate and secondarily when the CGA is joined to the printed circuit board at elevated reflow temperatures above the liquidus temperature of the solder core.

Further, for high content lead bearing columns (Pb80~Pb95), the exoskeleton sleeves can optionally be joined to the lead (Pb) rich solder column cores using a tin-lead hot solder immersion bath at temperatures ranging between approximately 183° C. and approximately 220° C. The hot solder bath can comprise Sn63/Pb37 with approximately 63% tin (Sn) by weight and approximately 37% lead (Pb) by weight with additives to optimize malleability producing a ductile column that can survive an increasing number of drop-shock test cycles. Alternatively high melting point solder (HMP) hot solder bath can comprise Pb93.5/Sn5/Ag1.5, or other high lead content solder (Pb80~Pb95) with melting temperatures above 296° C.

In accordance with another aspect of some arrangements disclosed herein, approximately 0.007 mm to approximately 0.015 mm (0.0003~0.0006 inch) of molten Sn63/Pb37 or high lead content solder (Pb80-Pb95) alloy can cover an entire column with at least approximately 10% of the diameter of the exoskeleton partially embedding into the exterior skin of the solder core material during the tin-lead hot solder bath process. Subsequently, in some arrangements, the solder column structure can be configured such that up to approximately 50% of the diameter or thickness of the exoskeleton can embed into the skin of the solder core during attachment of the column to the CGA substrate and secondarily when the CGA is joined to the printed circuit board at elevated reflow temperatures above the liquidus temperature of the solder core.

Further, in another arrangement disclosed herein, for low content lead bearing columns (Pb36~Pb40), the exoskeleton sleeves can be joined to low temperature lead (Pb) solder column cores using a tin-bismuth hot solder immersion bath at approximately 138° C. The hot solder bath can comprise Bi58/Sn42 with approximately 58% bismuth (Bi) by weight and approximately 42% tin (Sn) by weight with additives including, but not limited to Indium (In), as well as others, to optimize malleability producing a ductile column that can survive an increasing number of drop-shock test cycles. Alternatively, the hot solder immersion bath can be at approximately 183° C. to 220° C. comprising Sn63/Pb37 or approximately 179° C. to 220° C. comprising Sn62/Pb36/Ag2.

In accordance with another aspect of some arrangements disclosed herein, approximately 0.007 mm to approximately 0.015 mm (0.0003~0.0006 inch) of molten Bi58/Sn42 alloy can cover an entire column with at least approximately 10% of the diameter of the exoskeleton partially embedding into the exterior skin of the solder core material during the tin-bismuth hot solder bath process. Subsequently, in some arrangements, up to approximately 50% of the diameter or thickness of the exoskeleton can embed into the skin of the solder core during attachment of the column to the CGA substrate and secondarily when the CGA is joined to the printed circuit board at elevated reflow temperatures above the liquidus temperature of the solder core.

Figure 8:
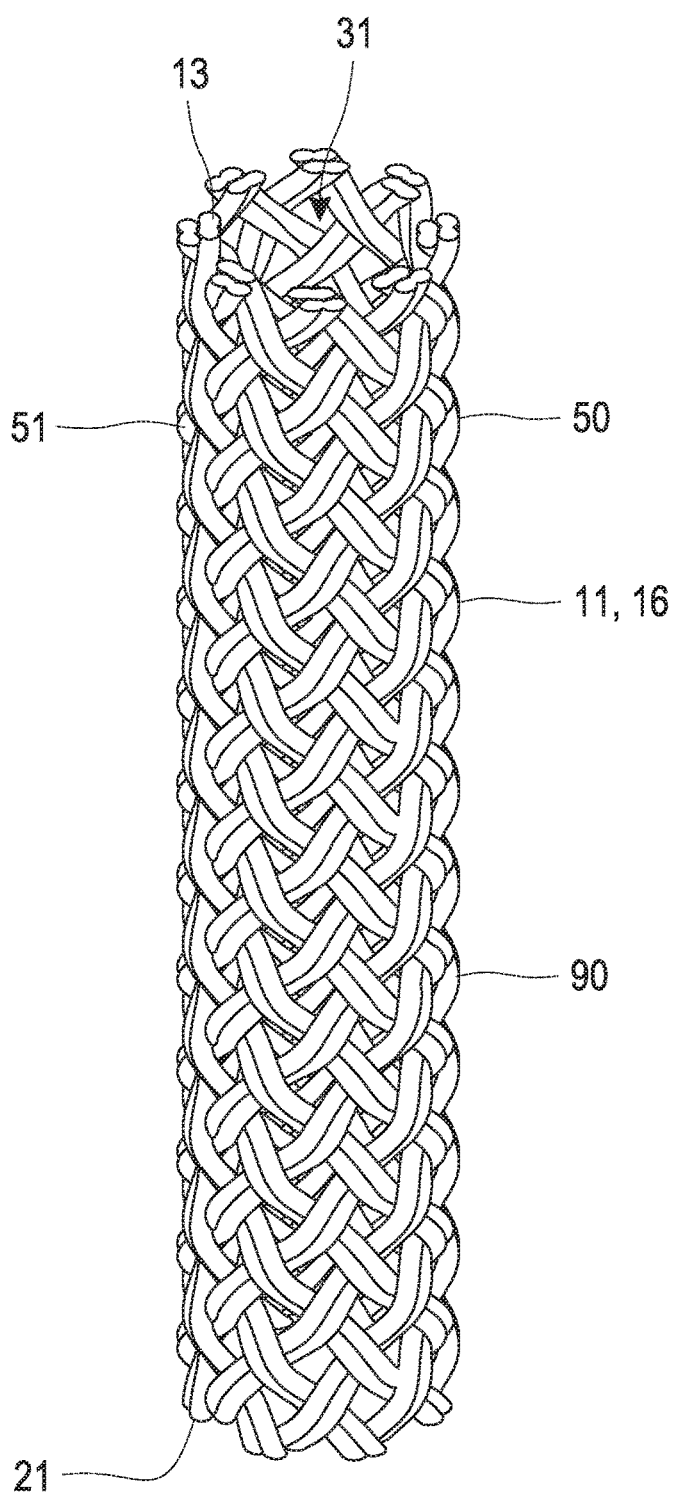
FIG. 8 is a perspective view of an arrangement of an exoskeleton sleeve, such as shown in FIG. 1 having an air core (i.e., without an interior solid cylindrical core).

Any arrangements of the column disclosed herein can also have coreless construction (i.e., without an interior solid cylindrical core) without using physical materials for the core 30, which can be referred to as an air core 31 as shown in, for example, without limitation, FIG. 8. The coreless (air core) version can have an exoskeleton formed by a plurality of wires 11 (or 16) as designated at 90. Overlapping junctions of wire 50 may be electroplated and/or immersion coated in a liquefied bath of solder resulting in a plurality of joints 51. The free ends of the wire 11 (or 16) are designated as 13 and 14. The wire 11 in any arrangements disclosed herein can comprise copper, beryllium-copper alloy, palladium coated copper, silver, and/or gold, and can be round, square, or any other shape disclosed herein, known in the art, or later developed. Any arrangements disclosed herein can have wires such as the wires shown in FIGS. 9A and 9C of approximately 0.0508 mm (0.002 inch) or smaller diameter. Arrangements of the flat wire 16 can comprise flattened copper, beryllium-copper, silver and/or gold wire 17 shown in FIGS. 9B and 9D having a thickness less than approximately 0.0508 mm (0.002 inch) and a width less than approximately 0.204 mm (0.008 inch) or otherwise. Beryllium copper alloy such as C172000 or C173000 for wire 11 (or 16) exhibits the benefit of springiness to provide mechanical compliancy for absorbing stresses caused by mismatching CTE between the LGA/CGA substrate and PCB Board.

Any arrangements disclosed herein can comprise any combination of the foregoing methods, devices, components, materials, and any other details of the foregoing arrangements or aspects of the arrangements.

While certain arrangements of the inventions have been described, these arrangements have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, arrangement, or example are to be understood to be applicable to any other aspect, arrangement or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing arrangements. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some arrangements, the actual steps taken in the processes illustrated and/or disclosed may differ from those shown in the figures. Depending on the arrangement, certain of the steps described above may be removed, others may be added. Furthermore, the features and attributes of the specific arrangements disclosed above may be combined in different ways to form additional arrangements, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular arrangement. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain arrangements include, while other arrangements do not include, certain features, elements, and/or steps. Thus, such conditional language is not generally intended to imply that features, elements, and/or steps are in any way required for one or more arrangements or that one or more arrangements necessarily include logic for deciding, with or without user input or prompting, whether these features, elements, and/or steps are included or are to be performed in any particular arrangement.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain arrangements require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain arrangements, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred arrangements in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A solder column, comprising:
    a solder core comprising a solder core material;
    an exoskeleton sleeve structure surrounding at least a majority of an outside surface of the solder core and comprising a plurality of wires woven together to form a mesh; and
    a plurality of spaces formed in the exoskeleton between the plurality of wires;
    wherein:
        the exoskeleton sleeve is configured such that the exoskeleton sleeve will support the solder core so as to prevent a collapse of the solder core at temperatures exceeding a liquidus temperature of the solder core;
        each of the plurality of spaces has a width and a height that is at least as large as a width of the wire adjacent to the space; and
        the spaces are configured to provide additional flexibility to the solder column to improve the ability of the solder column to absorb stresses caused by mismatches in the coefficient of thermal expansion between the substrates interconnected by the solder column.

2. The solder column of claim 1, wherein the plurality of wires form a diamond pattern about the exoskeleton.

3. The solder column of claim 1, wherein the plurality of wires each has a width from approximately 0.025 mm (0.001 inch) to approximately 0.076 mm (0.003 inch).

4. The solder column of claim 1, wherein the spaces each has a width and a height from approximately 0.050 mm (0.002 inch) to approximately 0.125 mm (0.005 inch).

5. The solder column of claim 1, wherein the spaces each have a width and a height from approximately 0.050 mm (0.002 inch) to approximately 0.125 mm (0.005 inch) and wherein a total surface area of the spaces is from approximately 10% to approximately 20% of a total surface area of the exoskeleton sleeve.

6. The solder column of claim 1, wherein the spaces each have a width from approximately 2 wire widths or diameters to approximately 4 wire widths or diameters and a height from approximately 2 wire widths or diameters to approximately 4 wire widths or diameters.

7. The solder column of claim 1, wherein the exoskeleton sleeve comprises a first wire that intersects and passes over or under a second wire at an angle that is from approximately 80° to approximately 100° relative to the second wire.

8. The solder column of claim 1, wherein the exoskeleton sleeve comprises a first wire that intersects and passes over or under a second wire at an approximately 90° angle.

9. The solder column of claim 1, wherein the wires of the plurality of wires each intersects and passes over or under other wires of the plurality of wires at an approximately 90° angle.

10. The solder column of claim 1, wherein the wires of the plurality of wires each intersects and passes over or under other wires of the plurality of wires at an angle that is from approximately 80° to approximately 100° relative to the other wires of the plurality of wires.

11. The solder column of claim 1, wherein the solder column is configured such that the solder core material will form a bond with conductive pads of an LGA/CGA and/or a printed circuit board without the solder core collapsing when the solder core material is in a molten state.

12. The solder column of claim 1, wherein the exoskeleton sleeve is further configured to improve a conduction of heat through the solder column.

13. The solder column of claim 1, wherein the solder column is configured such that solder from the solder core will form a bond with conductive pads of an LGA/CGA and/or a printed circuit board without a use of a solder paste when a temperature of the solder core exceeds the liquidus temperature of the solder core.

14. The solder column of claim 1, wherein at least a portion of a thickness of the exoskeleton sleeve is embedded into the solder core.

15. The solder column of claim 1, wherein the exoskeleton sleeve comprises 4, 8, 12, 16, 20, 24, 32, or 48 strands of wire.

16. The solder column of claim 1, wherein one or more of the wires comprises at least one of copper, beryllium-copper, silver and gold.

17. The solder column of claim 1, wherein one or more of the wires comprises palladium coated copper.

18. The solder column of claim 1, wherein one or more of the wires has a rectangular cross-section.

19. The solder column of claim 1, wherein one or more of the wires has a rectangular cross-section having a thickness in a radial direction of the exoskeleton sleeve of approximately 0.050 mm (0.002 inch) or less and a width of approximately (0.204 mm 0.008 inch) or less.

20. The solder column of claim 1, wherein the exoskeleton sleeve surrounds an entire length of the solder core.

21. The solder column of claim 1, wherein the plurality of spaces are partially or fully filled with solder.

22. The solder column of claim 1, wherein the exoskeleton sleeve comprises a plurality of electroplated joints between plurality of wires.

23. The solder column of claim 1, wherein up to approximately 50% of a thickness of the exoskeleton can embed into the solder core when a temperature of the solder core is above the liquidus temperature of the solder core.

24. The solder column of claim 1, wherein the solder comprises at least one of SAC305, Sn63/Pb37, Pb80/Sn20, Pb90/Sn10 and Pb93.5/Sn5/Ag1.5.

25. The solder column of claim 1, wherein the exoskeleton comprises at least one of copper, palladium coated copper and beryllium-copper alloy.

26. A solder column, comprising:
a solder core comprising a solder core material;
an exoskeleton sleeve structure surrounding at least a portion of the solder core and comprising a plurality of wires woven together to form a mesh; and
a plurality of spaces formed in the exoskeleton between the plurality of wires;
wherein:
  the plurality of wires comprises a plurality of wire pairs each comprising a first wire and a second wire, the second wire being adjacent to the first wire along an entire length of the first wire;
  the exoskeleton sleeve is configured to support the solder core, particularly at elevated temperatures exceeding a liquidus temperature of the solder core, and to improve the heat conduction of the solder column; and
  the spaces are configured to provide additional flexibility to the solder column to improve the ability of the solder column to absorb stresses caused by mismatches in the coefficient of thermal expansion between the substrates interconnected by the solder column.

\* \* \* \* \*